United States Patent [19]

Kawana et al.

[11] Patent Number: 5,501,629
[45] Date of Patent: Mar. 26, 1996

[54] BUFFING APPARATUS SUITABLE TO BUFF THIN PLATE WORK AND CONTROLLING METHOD FOR THE APPARATUS

[75] Inventors: Eishirou Kawana; Hitoshi Ogawa; Koichi Ishida; Kazuo Aoki, all of Kawasaki, Japan

[73] Assignee: Fujitsu Limited, Kawasaki, Japan

[21] Appl. No.: 117,928

[22] Filed: Sep. 8, 1993

[30] Foreign Application Priority Data

Sep. 10, 1992 [JP] Japan .................................. 4-241658
Oct. 16, 1992 [JP] Japan .................................. 4-278661

[51] Int. Cl.$^6$ ........................................... B24B 1/00
[52] U.S. Cl. .............................. 451/28; 451/58; 451/182; 451/188; 451/178; 451/907
[58] Field of Search ................................ 451/28, 58, 178, 451/182, 183, 188, 195, 207, 241, 332, 336, 907

[56] References Cited

U.S. PATENT DOCUMENTS 4,941,290 7/1990 Holyoke .................................. 451/188
5,046,286 9/1991 Holyoke .................................. 451/188

Primary Examiner—Bruce M. Kisliuk
Assistant Examiner—Eileen Morgan
Attorney, Agent, or Firm—Armstrong, Westerman, Hattori, McLeland & Naughton

[57] ABSTRACT

A buffing apparatus which can buff a thin plate work without causing buckling. The buffing apparatus comprises a plurality of buffing rolls removably secured in a predetermined spaced relationship from each other to a shaft which is driven to rotate, a backup roll disposed in parallel to the buffing rolls and extending over the overall length of all of the buffing rolls, and a holding roll disposed at least between each adjacent ones of the buffing rolls. The holding roll is positioned such that the axis thereof is positioned on a straight line interconnecting the center of transverse section of one of the buffing rolls and the center of a transverse section of the backup roll and an outer periphery thereof substantially contacts with a contacting plane of the buffing rolls.

10 Claims, 23 Drawing Sheets

WORK FEED DIRECTION

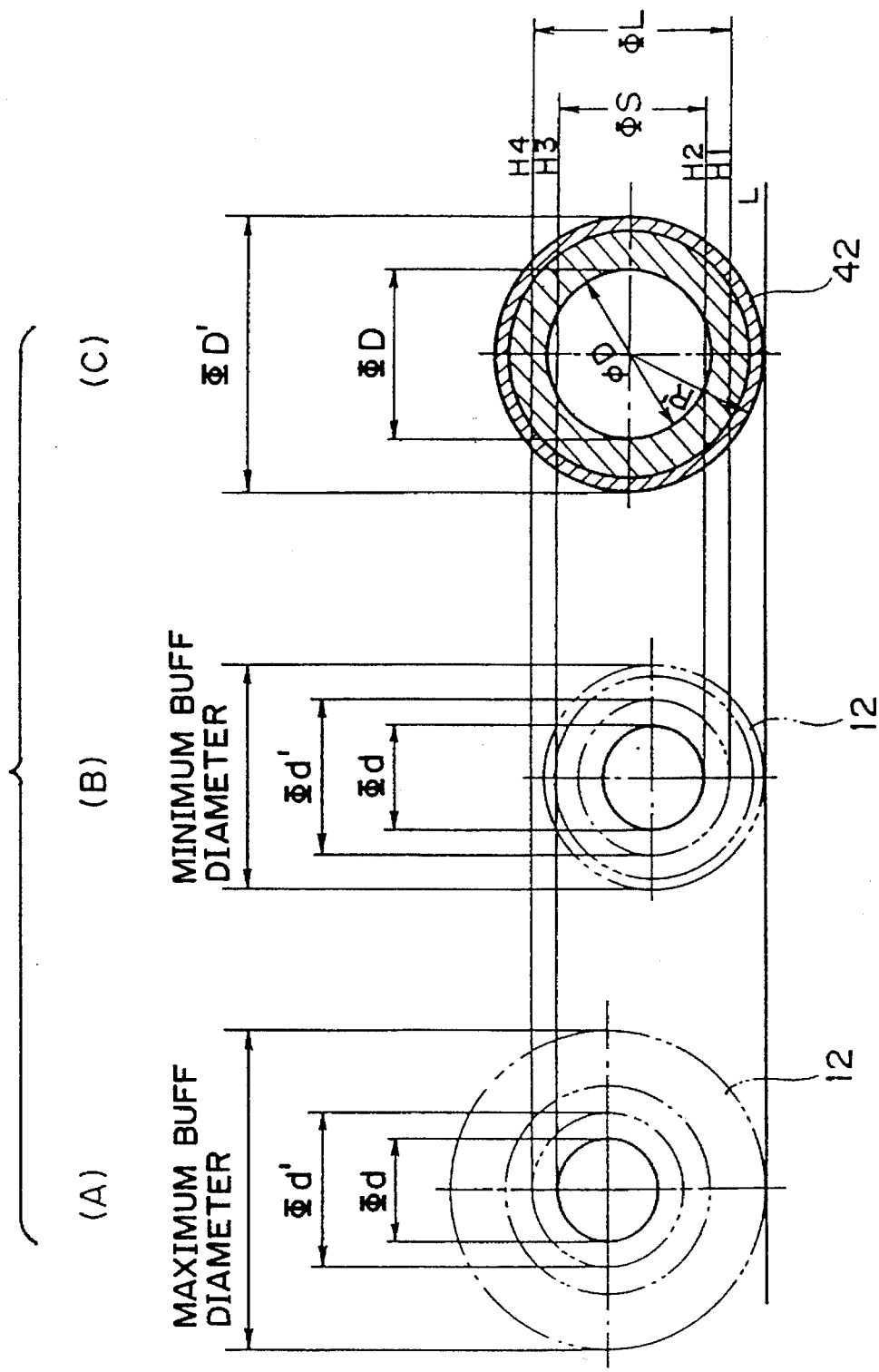

BUFFING APPARATUS SUITABLE TO BUFF THIN PLATE WORK AND CONTROLLING METHOD FOR THE APPARATUS

BACKGROUND OF THE INVENTION

1. Field of the Invention

This invention relates to a buffing apparatus, and more particularly to a buffing apparatus suitable to buff a thin plate work.

2. Description of the Related Art

In recent years, an increase in density of thin wires on a printed circuit board and an increase in number of layers of thin plates are demanded in accordance with a demand for miniaturization and increase in performance of various electronic apparatus. Consequently, reduction in thickness of thin plates as inner-layer materials has proceeded, and polishing of such thin plate inner layer materials is required as a surface treatment to remove rust, soil and so forth of inner layer materials. However, the reduction in thickness of thin plates of inner layer materials to be polished so proceeds that, when a thin plate inner layer material is buffed using a buffing apparatus which is used popularly, the inner layer material is subjected to buckling by an extruding force of a buffing roll, resulting in failure in buffing. Therefore, it is demanded to develop a buffing apparatus suitable to buff a thin plate.

An exemplary one of conventional buffing apparatus will be described below with reference to FIGS. 1 to 4.

Referring first to FIGS. 1 and 2, an elongated buffing roll 2 is secured to a shaft 3 which is driven to rotate, and a backup roll 4 is disposed in an opposing relationship to the buffing roll 2. The buffing roll 2 includes an annular core 7 and an annular buff 2a secured to the annular core 7. Referring particularly to FIG. 2A, reference numeral 8 denotes a space. Pinch rolls 6 are each biased by an air cylinder or a like element into contact with a feed roll 5 which is driven to rotate.

A conventional fixing structure for the buffing roll will be described below with reference to FIGS. 3 and 4. The shaft 3 has a pair of threaded portions 3a formed at predetermined locations at the opposite end portions thereof, and the buffing roll 2 is secured to a predetermined location of the shaft 3 by fitting the elongated buffing roll 2 onto the shaft 3, inserting a pair of spacer collars 10 into the buffing roll 2 from the opposite ends of the buffing roll 2 and tightening a pair of threaded rings 11 to the threaded portions 3a of the shaft 3.

While a plate work is fed by the roll pairs each including the feed roll 5 and the pinch roll 6 with the lower face thereof held by the backup roll 4, the buffing roll 6 is rotated at the speed of about 2,000 to 3,000 rpm to buff the upper face of the plate work.

However, since the conventional buffing apparatus adopts the elongated buffing roll 2, it has a problem in that, when the thin plate member 9 is buffed, as the rear end of the plate member 9 passes the buffing roll 2, it is subjected to buckling by the force of the buffing roll 2 so that it is bent or Curved. Buffing of a thin plate less than 0.2 mm thick is impossible with the conventional buffing apparatus which adopts such elongated buffing roll 2.

Further, in conventional buffing apparatus, since the feeding mechanism for a buff shaft is of a one-stage slide type which employs a motor as a power source and adaptation to the thickness of a work and control of the polishing pressure are performed by the single motor, there is a problem in that accurate pressure adjustment cannot be achieved.

Furthermore, since conventional buffing apparatus does not employ the method of measuring the diameter of the buffing roll to control the origin or the starting point but employs a positioning system wherein the point of time when the buffing roll is contacted with the backup roll is set to the origin, each time a work having a different thickness is supplied, setting of the origin must be performed, and accordingly, it is impossible to successively supply works having different thicknesses.

SUMMARY OF THE INVENTION

Accordingly, it is an object of the present invention to provide a buffing apparatus which can buff a thin plate work without causing buckling.

It is another object of the present invention to provide a controlling method for a buffing apparatus by which a thin plate work can be buffed without causing buckling.

It is a further object of the present invention to provide a controlling method for a buffing apparatus by which the buffing amount can be controlled optimally in response to the thickness and/or the width of a plate work.

It is a still further object of the present invention to provide a novel buffing method for buffing a plate work.

In accordance with an aspect of the present invention, there is provided a buffing apparatus, which comprises a plurality of buffing rolls removably secured in a predetermined spaced relationship from each other to a shaft which is driven to rotate, a backup roll disposed in parallel to the buffing rolls and extending over an overall length of all of the buffing rolls, and a holding roll disposed at least between each adjacent ones of the buffing rolls, the holding roll being positioned such that the axis thereof is positioned on a straight line interconnecting a center of transverse section of one of the buffing rolls and a center of a transverse section of the backup roll and an outer periphery thereof substantially contacts with a contacting plane of the buffing rolls.

Where two such buffing apparatus are disposed in tandem such that the buffing rolls of the apparatus may be positioned in a zigzag pattern in the work feeding direction, an entire face of the thin plate work can be buffed.

With the buffing apparatus of the present invention, since the trailing end of the thin plate work can be held between the holding rolls and the backup roll, it can be prevented that the trailing end of the thin plate work is buckled to be bent or curved by the rotating buffing rolls.

In accordance with another aspect of the present invention, there is provided a method of controlling a buffing apparatus which includes buffing rolls and a backup roll disposed in parallel to the buffing rolls, comprising the steps of detecting, by means of a sensor provided on the upstream side in a work feeding direction in the proximity of the buffing roll, a plate work to be buffed, holding, when no plate work to be buffed is detected by the sensor, the buffing roll at a standby position spaced by a predetermined distance from the backup roll, driving, when a plate work to be buffed is detected by the sensor, the buffing roll to rotate and moving the buffing roll to a buffing position at which the buffing roll contacts with the plate work, and stopping the rotation of the buffing roll substantially at the same time when the sensor detects the trailing end of the plate work.

With the method of controlling a buffing apparatus of the present invention, the buffing roll is held in a standby condition at the position spaced by a predetermined distance from the backup roll, and after the sensor detects a plate work, the buffing rolls are driven to rotate and also moved toward the backup roll into contact with the plate work. Accordingly, save of the energy can be achieved. Further, since the buffing rolls are normally held at the standby position spaced by the predetermined distance from the backup roll, plate works having different thicknesses can be supplied successively.

Further, since rotation of the buffing rolls is stopped substantially at the same time when the sensor detects the trailing end of the plate work, it can be prevented effectively that the trailing end of the plate work is buckled to be bent or curved by the rotting buffing rolls. The controlling method is particularly effective for buffing of a thin plate work.

In accordance with a further aspect of the present invention, there is provided a buffing method for buffing a plate work using first and second buffing apparatus, each of the first and second buffing apparatus comprising a plurality of buffing rolls removably secured in a predetermined spaced relationship to a shaft which is driven to rotate, and a backup roll disposed in parallel to the buffing rolls and extending over the entire length of all of the buffing rolls, the buffing method comprising the steps of disposing the first buffing apparatus above the plate work, disposing the second buffing apparatus in a spaced relationship from the first buffing apparatus above the plate work, the buffing rolls of the first and second buffing apparatus being disposed in a zigzag pattern in a work feeding direction, buffing a first area of the plate work by the first buffing apparatus, and buffing a second area of the plate work, which has not been buffed by the first buffing apparatus, by the second buffing apparatus.

The above and other objects, features and advantages of the present invention and the manner of realizing them will become more apparent, and the invention itself will best be understood, from a study of the following description and appended claims, with reference to the attached drawings showing some preferred embodiments of the invention.

BRIEF DESCRIPTION OF THE DRAWINGS

FIG. 18 is a schematic view illustrating the relationship between a large diameter holding wheel and a buffing roll, and wherein FIG. 18(A) shows the buffing roll when the outer profile has a maximum size, FIG. 18(B) shows the buffing roll when the outer profile has a minimum size, and FIG. 18(C) shows the holding wheel;

DESCRIPTION OF THE PREFERRED EMBODIMENTS

Figure 5:
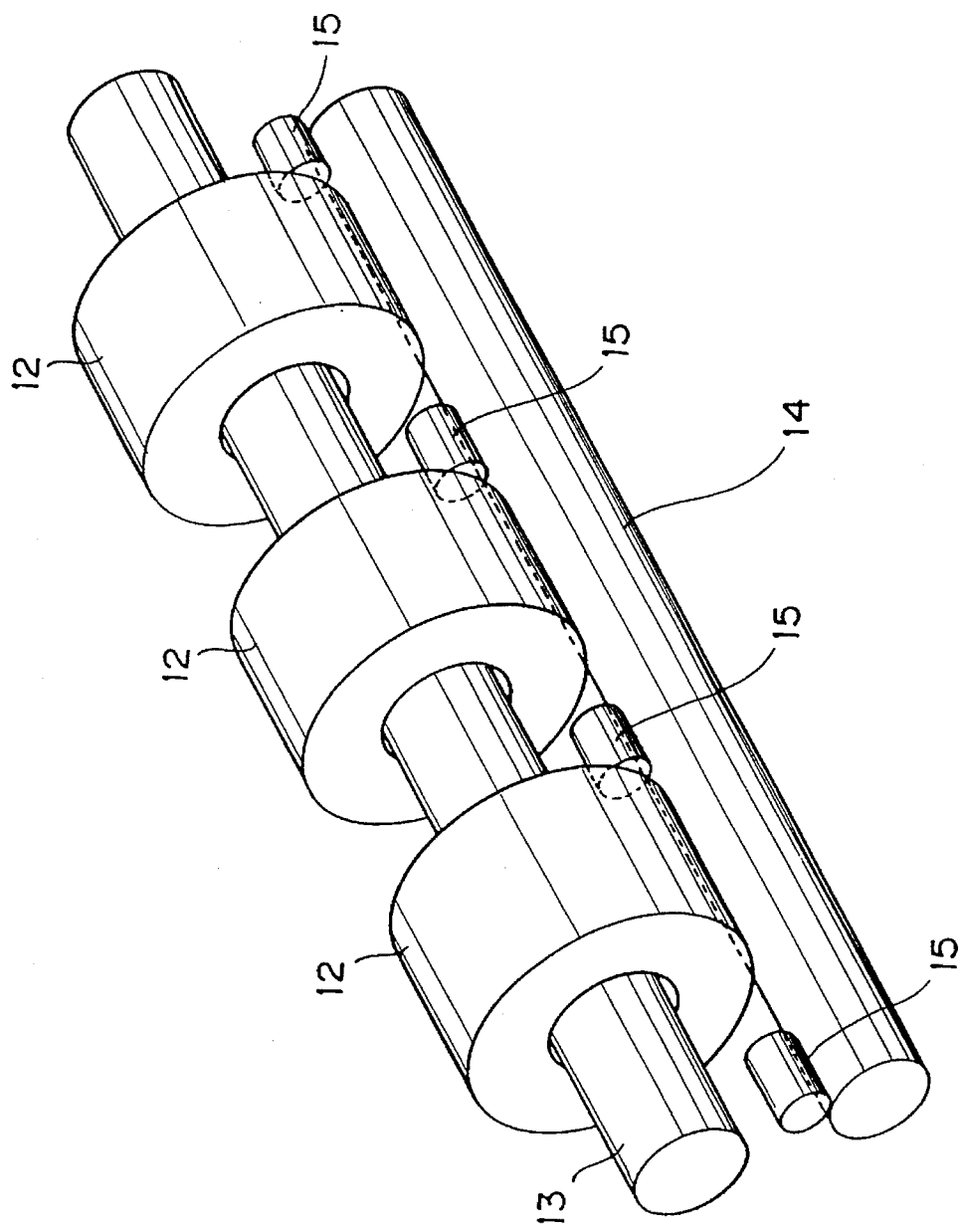
FIG. 5 is a schematic perspective view of a buffing apparatus showing a preferred embodiment of the present invention.

Referring first to FIG. 5, there is shown a schematic perspective view of a preferred embodiment of the present invention. A plurality of buffing rolls 12 are removably secured in a predetermined spaced relationship from each other to a shaft 13 which is driven to rotate. A backup roll 14 is disposed in parallel to the buffing rolls 12 and extends over the overall length of all of the buffing rolls 12.

A plurality of holding rolls 15 are disposed between each adjacent ones of the buffing rolls 12 and on the outer sides of the opposite end ones of the buffing rolls 12 such that the axis thereof are positioned on a straight line interconnecting the center of a transverse section of one of the buffing rolls 12 and the center of a transverse section of the backup roll 4 and they substantially contact with a contacting plane of the buffing rolls 12. Each of the holding rolls 15 is mounted using an L-shaped metal fastening member not shown so that it may not interfere with the shaft 13 for the buffing rolls 12.

Figure 6:
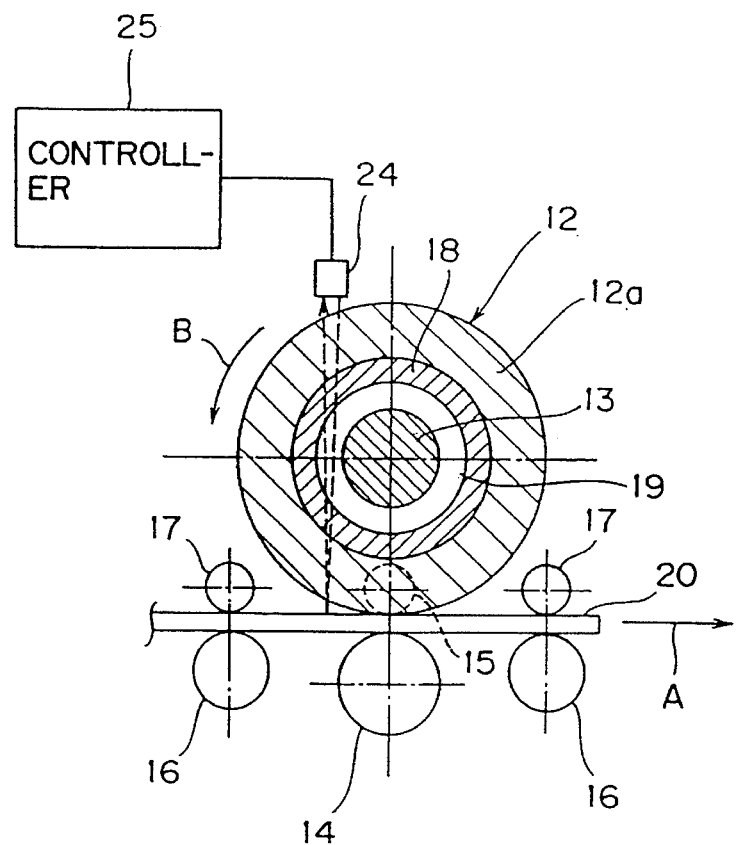
FIG. 6 is a transverse sectional view of the embodiment.

Referring now to FIG. 6, there is shown a transverse sectional view of the buffing apparatus shown in FIG. 5. Each of the buffing rolls 12 includes an annular core 18 and an annular buff 12a mounted on an outer periphery of the annular core 18. A space 19 is formed between the shaft 13 and the annular core 18. Reference numeral 16 denotes a feed roll which is driven to rotate, and a pinch roll 17 is disposed in an opposing relationship to each of such feed rolls 16 such that it may be moved into and out of contact with the feed roll 16 by means of an air cylinder. Also the holding rolls 15 are each urged by an air cylinder so that it may be moved into and out of contact with the backup roll 14.

A sensor 24 such as a photo-sensor is disposed on a little upstream side of the buffing rolls 12 in a work feeding direction and is connected to a control apparatus 25 such as a computer. Consequently, presence or absence of a plate work 20 can be detected by means of the sensor 24. Further, the thickness of the plate work 20 can be measured by calculating, by means of the control apparatus 25, the time required for light emitted from the sensor 24 to be reflected by the surface of the plate work 20 and introduced back into the sensor 24.

Figure 7:
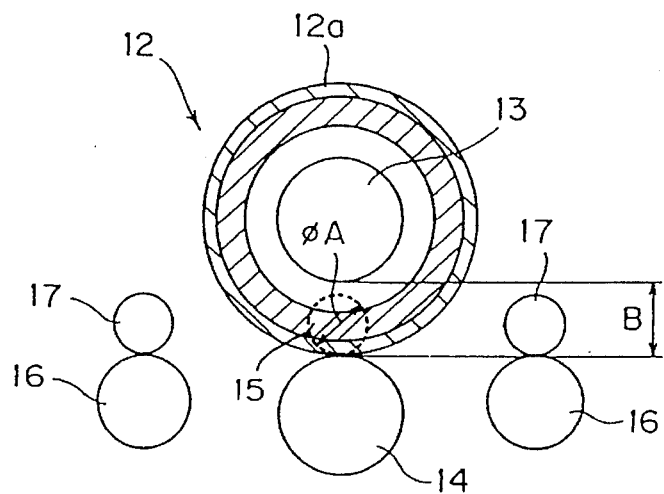
FIG. 7 is a transverse sectional view of the embodiment when a buffing roll is abraded.

FIG. 7 shows a buffing roll in an abraded condition. Where the diameter of the holding rolls 15 is represented by $\Phi A$ and the distance from the backup roll 14 to the shaft 13 is represented by B, the diameter of the holding rolls 15 must necessarily be set so that the expression $\Phi A < B$ is satisfied when the buffing roll is abraded as shown in FIG. 7.

Figure 8:
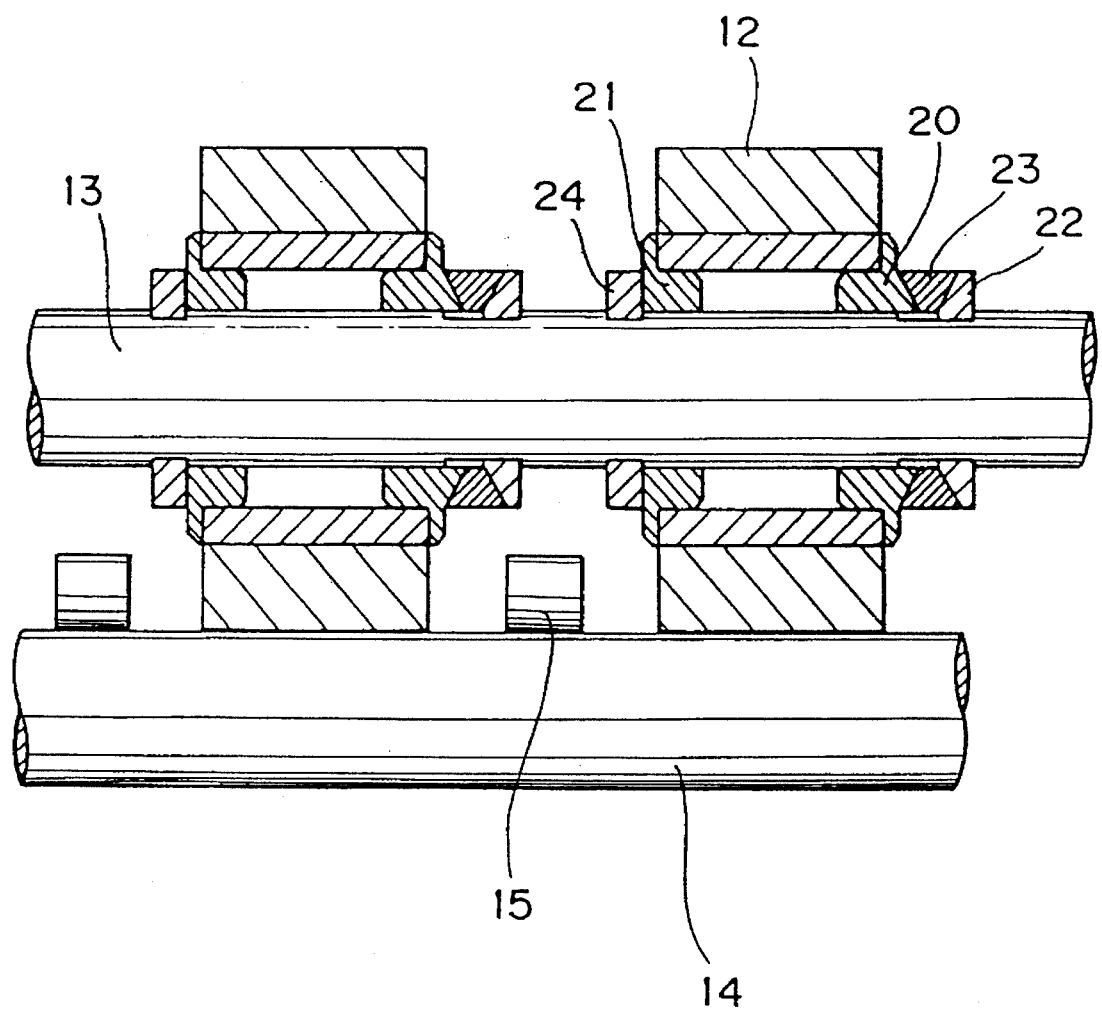
FIG. 8 is a longitudinal sectional view, partly in section, of the embodiment.
Figure 9:
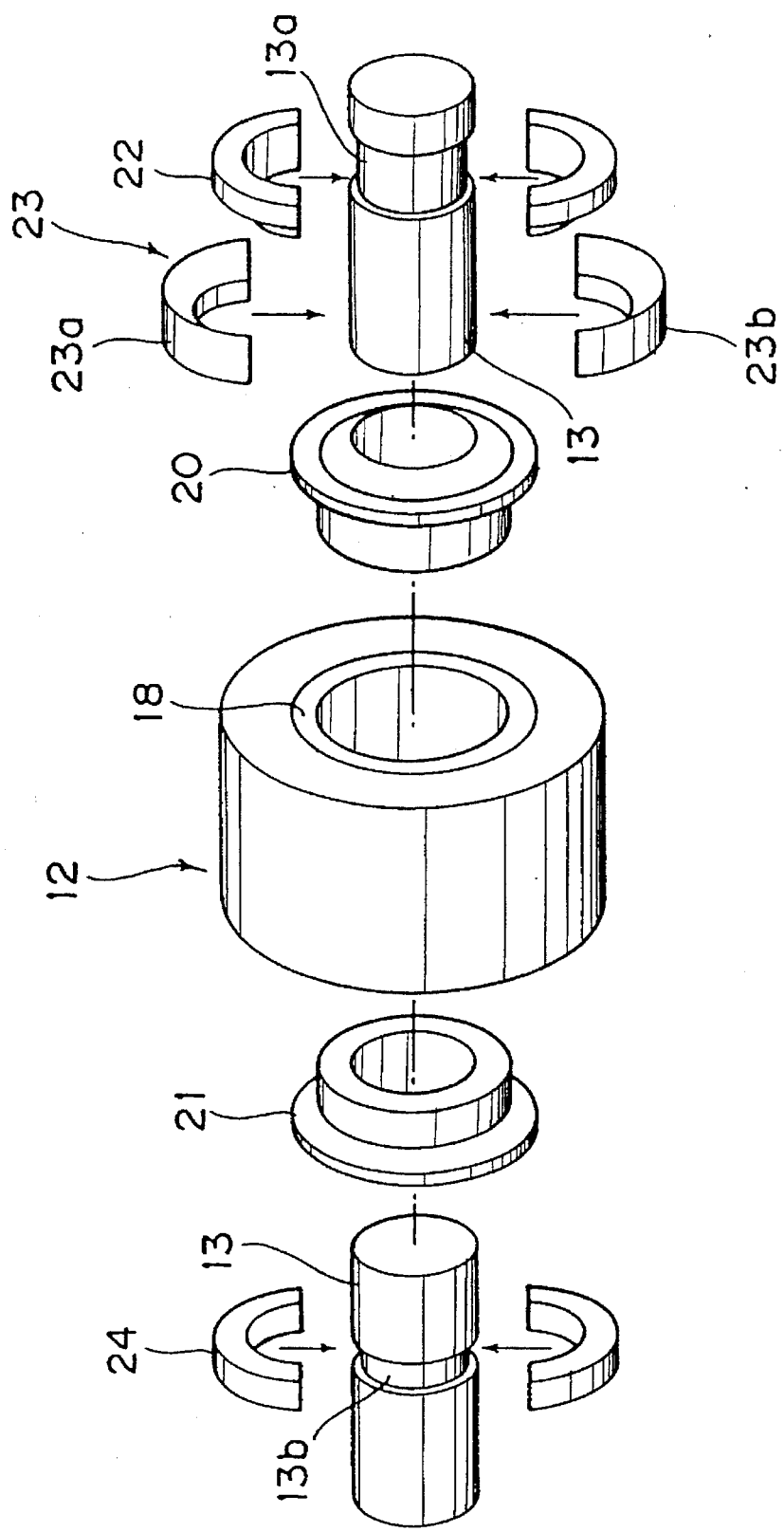
FIG. 9 is an exploded perspective view of a fixing structure for the buffing roll.

Subsequently, fixing means for the buffing rolls will be described with reference to the longitudinal sectional view of the embodiment of FIG. 8 and the exploded perspective view of FIG. 9. The shaft 13 has pairs of annular grooves 13a and 13b formed at predetermined locations thereof. The shaft 13 is inserted into the buffing rolls 12, and a thrust spacer collar 20 and a spacer collar 21 are inserted into the annular core 18 of each of the buffing rolls 12 from the opposite ends of the buffing roll 12. A two-segment split collar 24 is fitted into the annular groove 13b to secure the end of the buffing roll 12 by way of the spacer collar 21.

Figure 1:
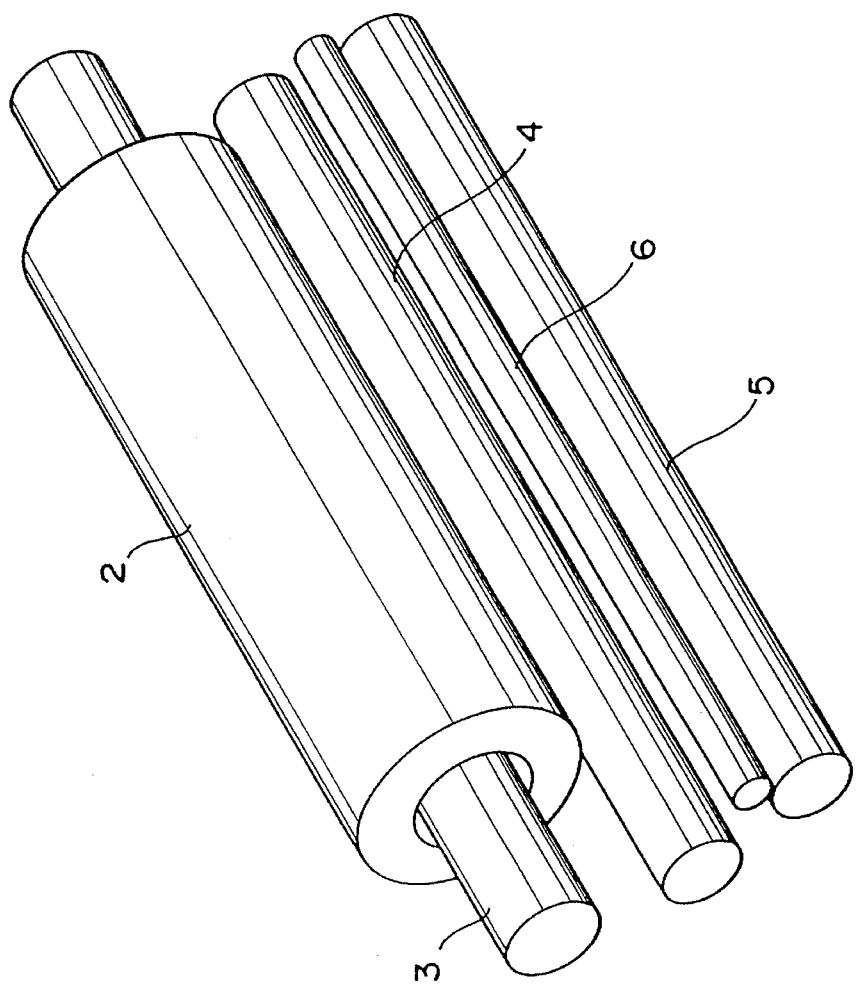
FIG. 1 is a schematic perspective view of a conventional buffing apparatus.
Figure 2A:
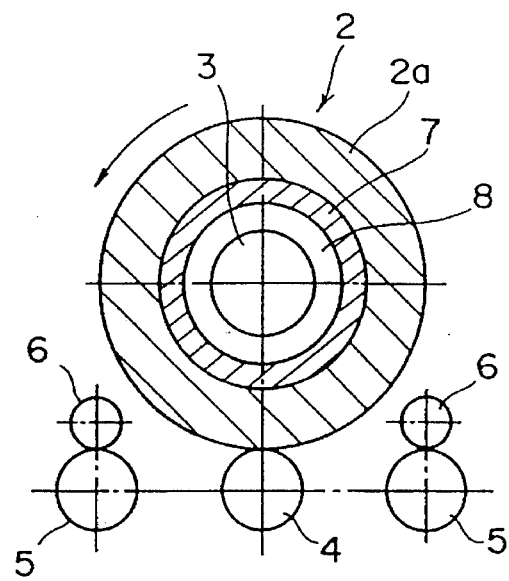
FIG. 2A is a transverse sectional view of the conventional buffing apparatus.
Figure 2B:
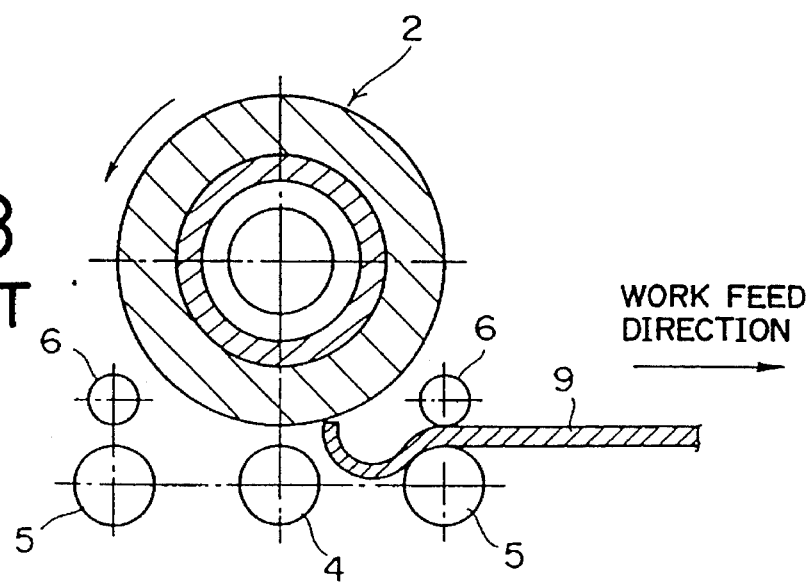
FIG. 2B is a similar view to FIG. 2A but illustrating a problem of the conventional buffing apparatus.
Figure 3:
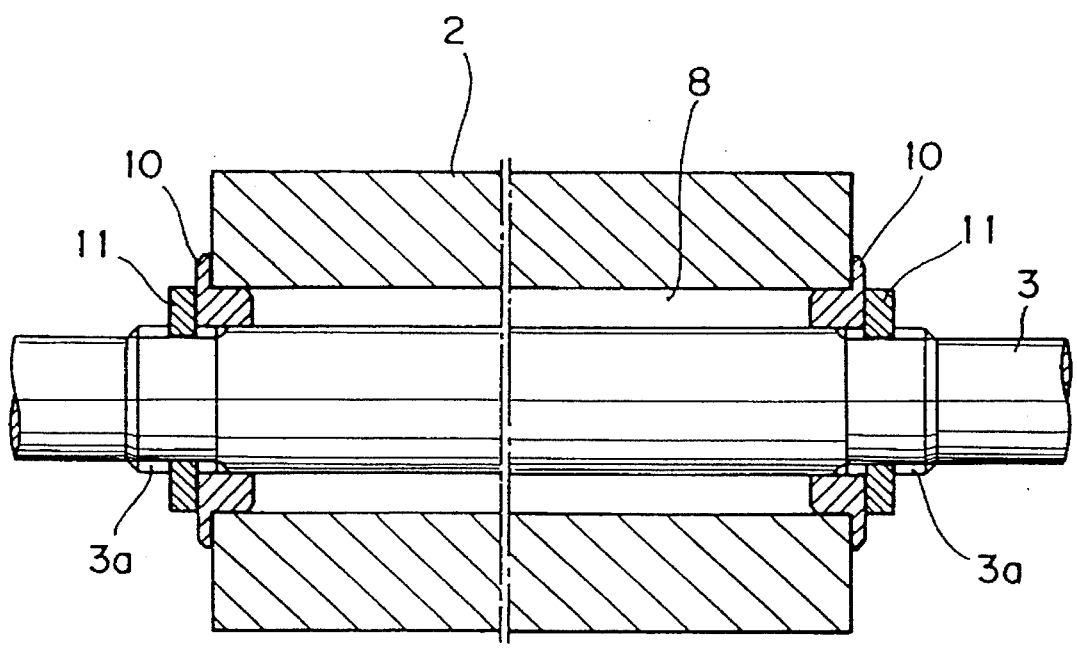
FIG. 3 is a longitudinal sectional view showing a conventional fixing structure for a buffing roll.
Figure 4:
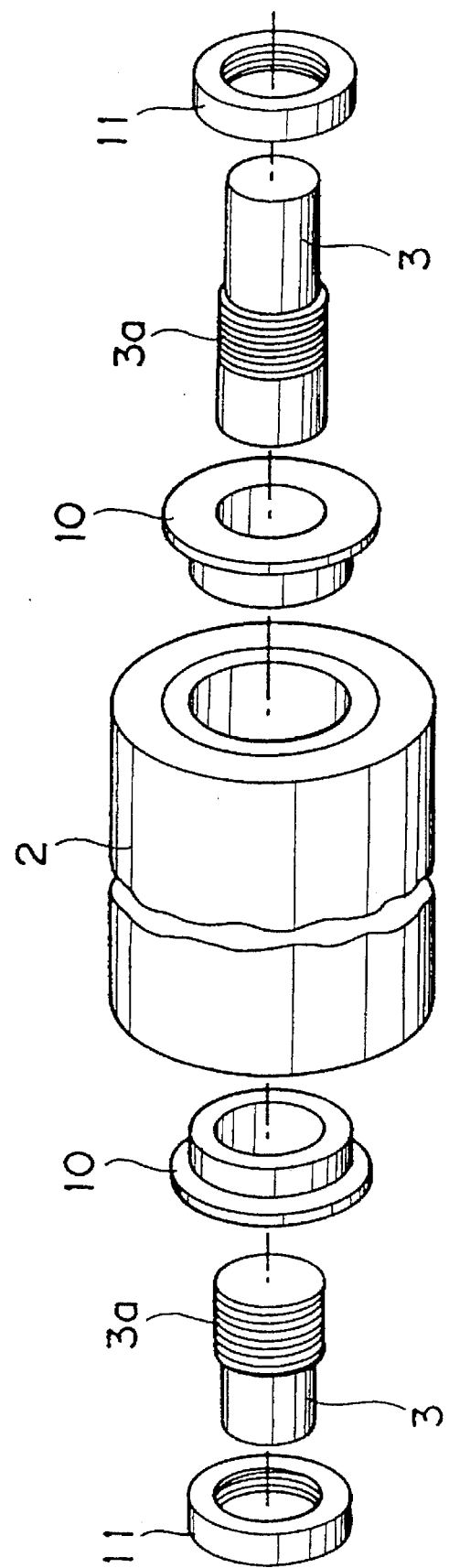
FIG. 4 is an exploded perspective view showing the conventional fixing structure for a buffing roll.
Figure 10:
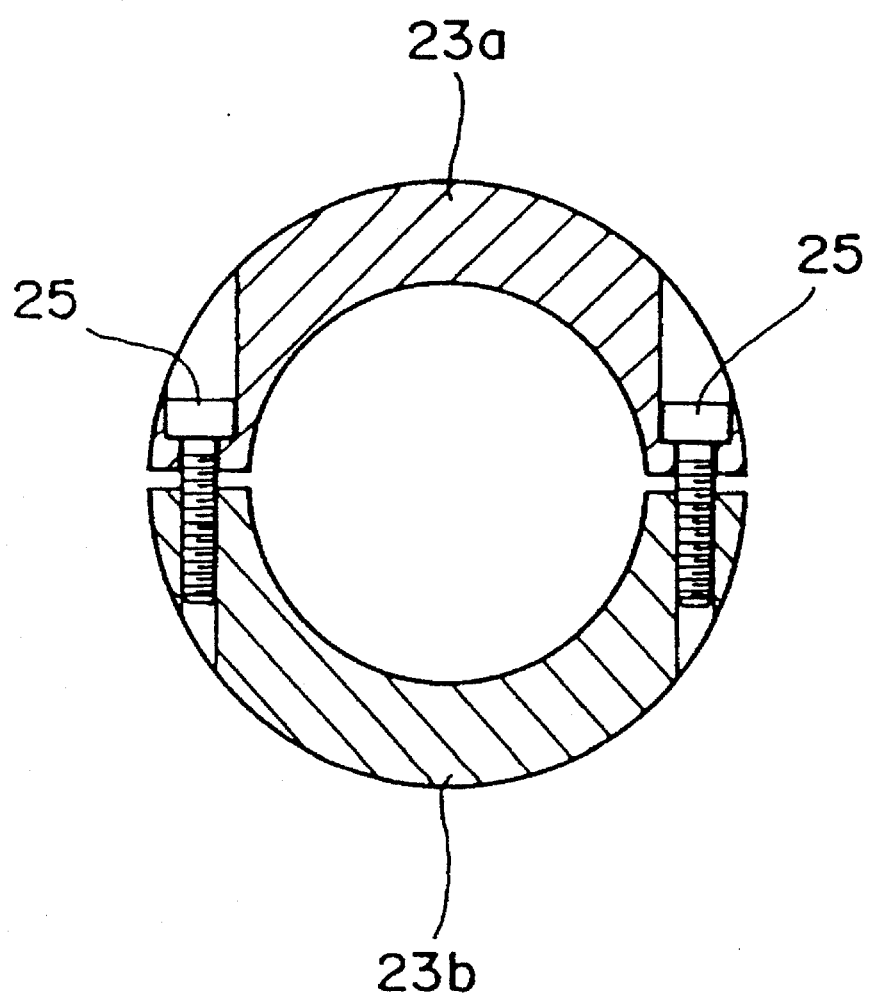
FIG. 10 is a sectional view of a thrust collar.

Further, another two-piece split fixing collar 22 is fitted into the annular groove 13a, and a pair of further two-piece split thrust collars 23 are tightened to the thrust spacer collar 20 and the thrust fixing collar 22 to fix the the other end of the buffing roll 12 while generating a thrust force. As shown in the sectional view of FIG. 10, the upper side thrust collar 23a is fastened to the lower side thrust collar 23b by means of a pair of fastening bolts 25. By sufficiently tightening the upper side thrust collar 23a to the lower side thrust collar 23b, the buffing roll 12 is secured in position as shown in FIG. 3.

Figure 11:
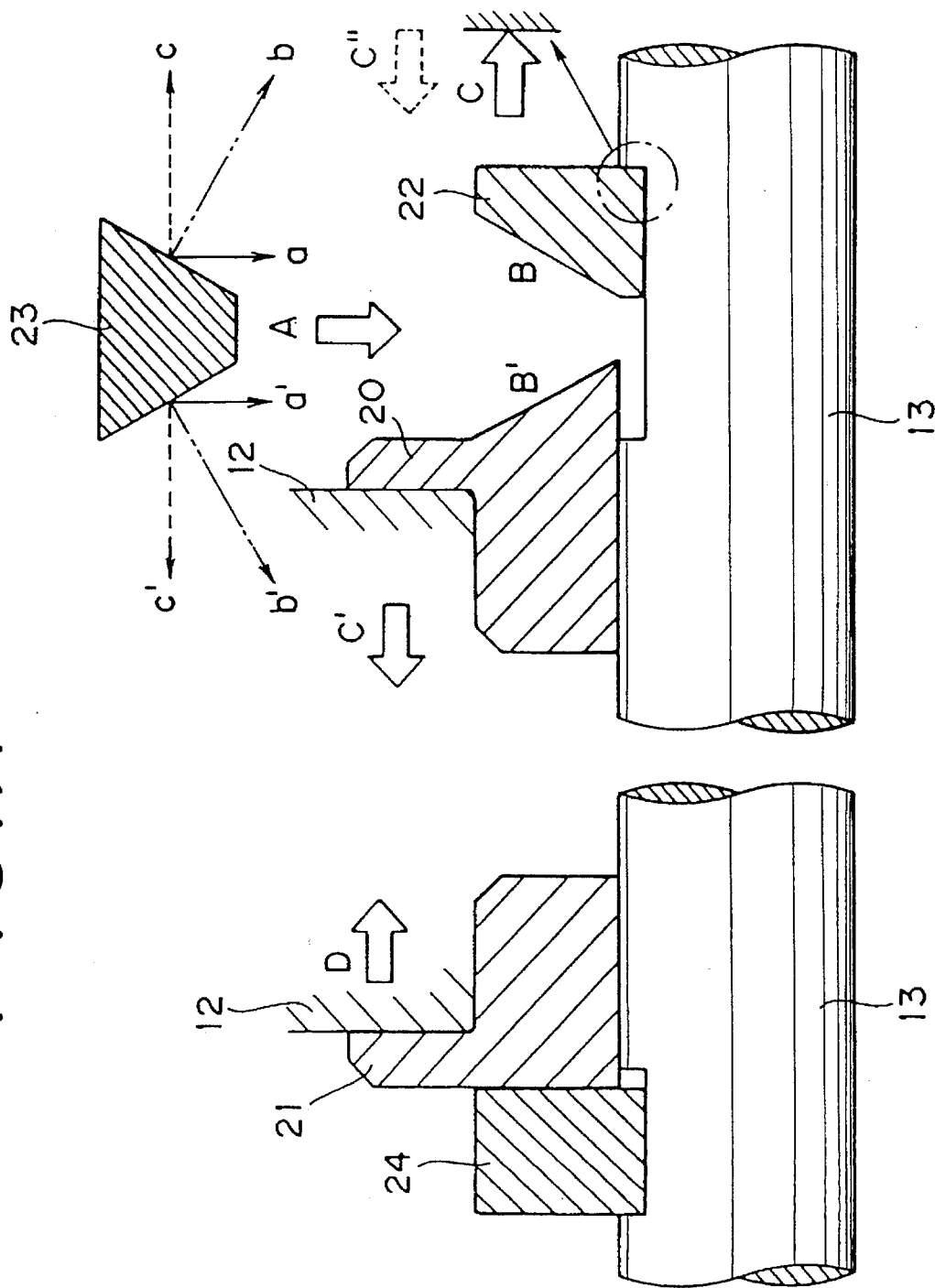
FIG. 11 is a schematic view illustrating forces applied to the buffing roll.

Subsequently, the relationship of forces applied to the buffing roll 12 when the thrust collars 23 are tightened will be described with reference to FIG. 11. First, when the thrust collars 23 are tightened, the thrust collars 23 are moved in the direction indicated by an arrow mark A, whereupon forces b and b' acting perpendicularly on faces B and B', respectively, are produced. The forces b and b' are decomposed into components a, c and a', c', respectively. Consequently, the buffing roll 12 is pushed by a force C' in the direction indicated by an arrow mark.

Meanwhile, the fixing collar 22 is pushed by another force C in the direction indicated by another arrow mark, and thereupon, as repulsion of the shaft 13, a repulsive force C" acting in the direction indicated by a broken line arrow mark is produced on the fixing collar 22. On the secured side of the buffing roll 12, a force D is produced by repulsion of the shaft 13. After all, the buffing roll 12 is secured to its reference position under the repulsive forces C" and D.

Figure 12:
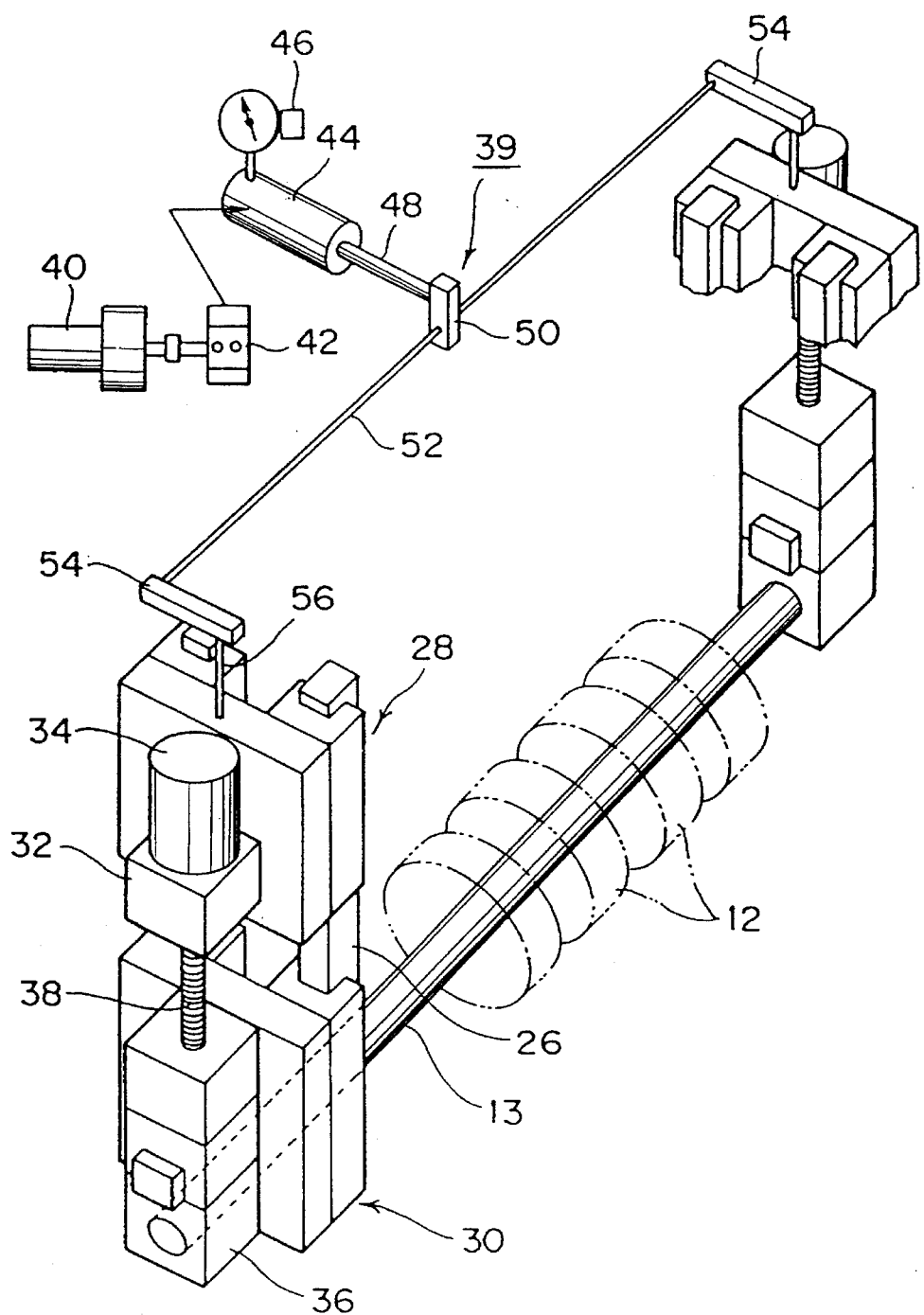
FIG. 12 is a perspective view of a holding structure for a buffing roll shaft.
Figure 13:
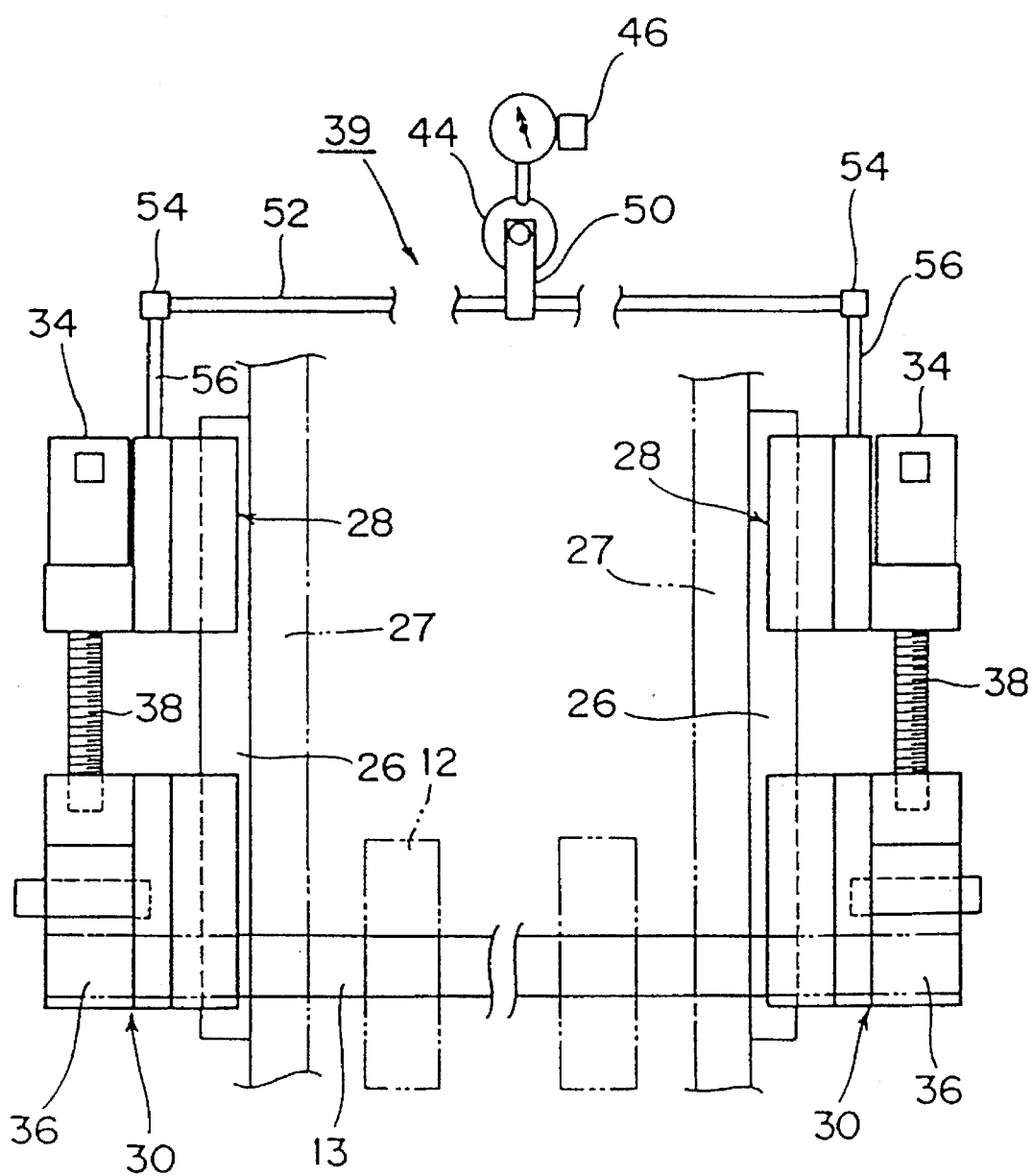
FIG. 13 is a front elevational view of the holding structure.

Subsequently, the holding structure for the buffing roll shaft will be described with reference to FIGS. 12 and 13. A pair of rails 26 are secured to a frame 27 and extends in a vertical direction as shown in FIG. 13, and a first slide unit 28 and a second slide unit 30 are mounted for sliding movement along each of the rails 26.

A servomotor 34 is mounted on a mounting block 32 integrally secured to each of the first slide units 28. A ball screw 38 is connected to an output shaft of the servomotor 34. Meanwhile, a bearing block 36 is integrally secured to each of the second slide blocks 30, and the shaft 13 is supported for rotation on a pair of such bearing blocks 36. The pair of ball screws 38 are screwed at lower end portions thereof in upper end portions of the bearing blocks 36 so that, when the servomotors 34 are energized, the ball screws 38 are rotated to move the second slide units 30 upwardly or downwardly along the rails 26.

Subsequently, a buffing pressure adjusting mechanism 39 will be described. When a hydraulic pump 42 is driven by a servomotor 40, pressurized oil is supplied into a hydraulic cylinder 44 to extend a piston rod 48. An end of the piston rod 48 is secured to one end side of an arm 50, and the other end side of the arm 50 is secured to a pressure adjustment shaft 52 supported for rotation by bearings not shown.

A pair of arms 54 are secured at ends thereof to the opposite ends of the pressure adjustment shaft 52 while a pair of pressure adjustment rods 56 are secured at ends thereof to the other ends of the arms 54. The other ends of the pressure adjustment rods 56 are secured to upper ends of the first slide units 28. Reference numeral 46 denotes a pressure signal generator, and rotation of the servomotor 40 is controlled by feedback control using a signal of the pressure signal generator 46 so that the hydraulic pressure supplied to the hydraulic cylinder 44 may be a predetermined value.

When the servomotors 34 are energized, the second slide units 36 are moved upwardly or downwardly so as to adjust the height of the shaft 13 in accordance with the thickness of the plate work to be buffed and the degrees of abrasion of the buffing rolls 12. Further, when the servomotor 40 is energized, the piston rod 48 is extended. The extending motion of the piston rod 48 is transmitted to the first slide units 28 by way of the arm 50, the pressure adjustment shaft 52, the arms 54 and the pressure adjustment rods 56 to move the first slide units 28 and the second slide units 30 downwardly together.

In the present embodiment, the buffing rolls 12 are controlled so that they may be contacted under a predetermined pressure with the plate work to be buffed by energizing the servomotor 40. By employing the two-stage sliding system in this manner, accurate pressure adjustment upon buffing can be achieved.

In the buffing apparatus of the present invention, the buffing roll is divided into a plurality of elements with holding rolls disposed between them. Therefore, the plate work is not buffed at part thereof with a single buffing apparatus.

Figure 14:
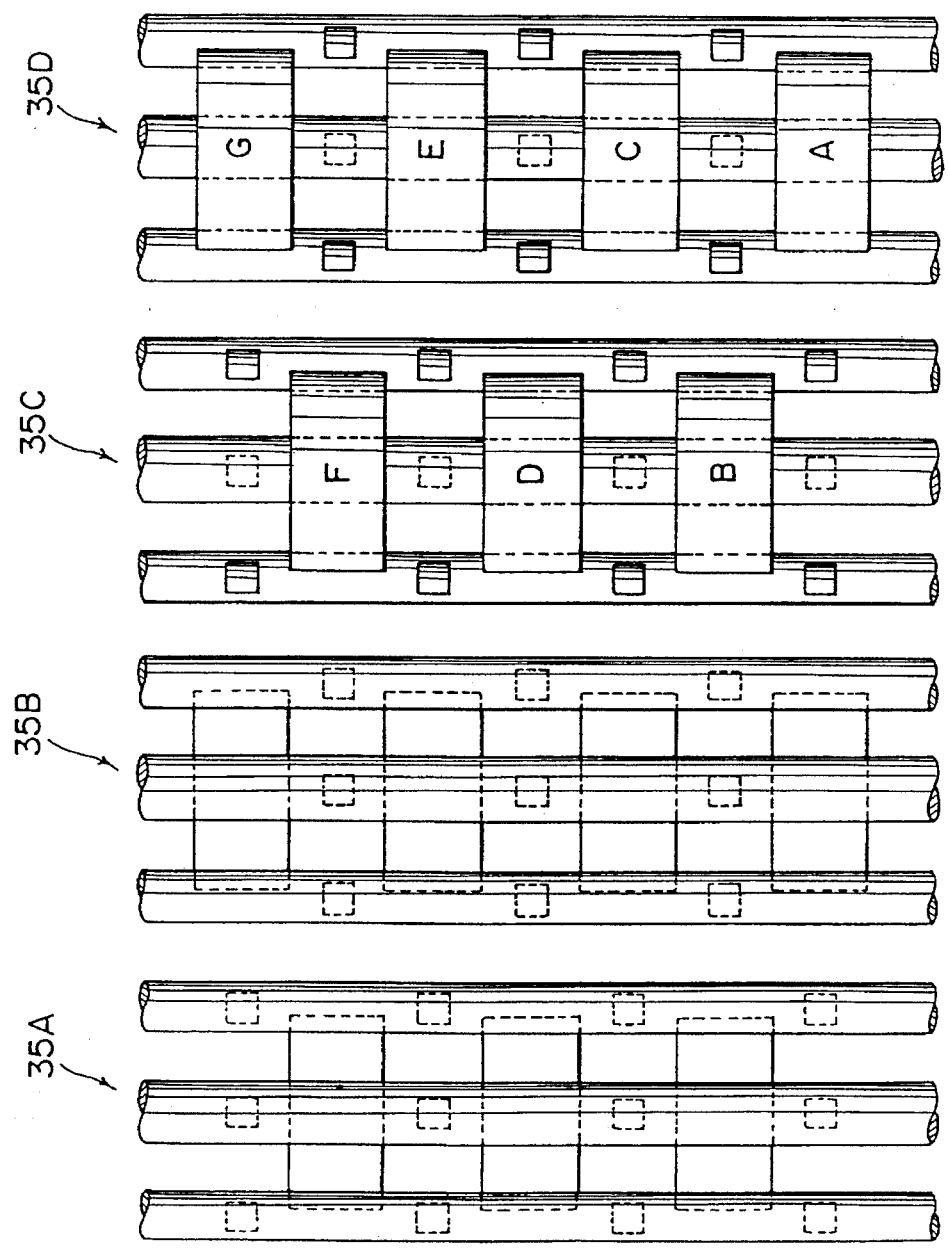
FIG. 14 is a plan view showing an arrangement of a buffing apparatus array.
Figure 15:
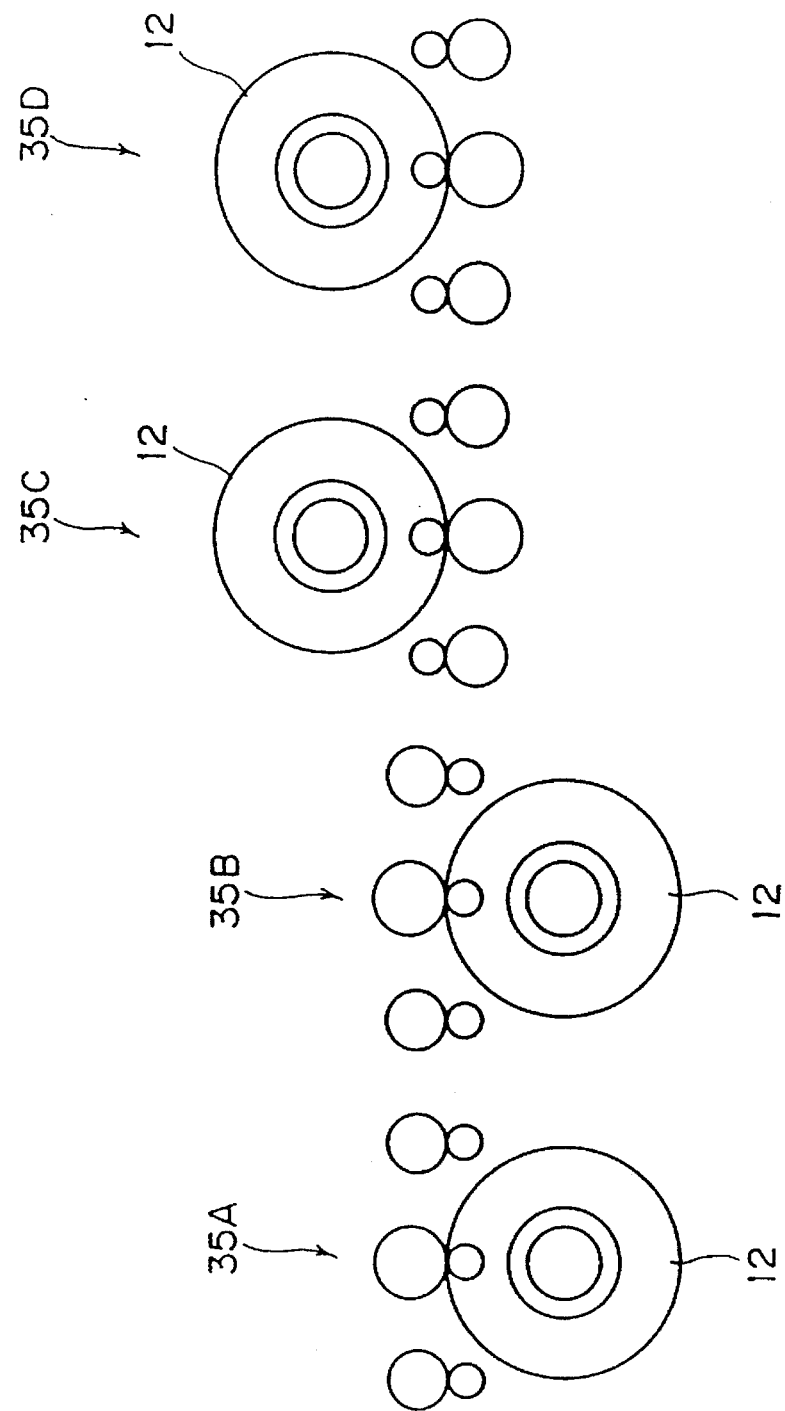
FIG. 15 is a side elevational view of the buffing apparatus array.

As a countermeasure, two buffing apparatus 35C and 35D are disposed above a thin plate work to be buffed such that the buffing rolls 12 of the apparatus 35C and 35D may be positioned alternately or in a zigzag pattern as shown in FIGS. 14 and 15 so that the entire face of the thin plate work can be buffed. Further, as best seen in FIG. 15, four buffing apparatus 35A, 35B, 35C and 35D may be disposed above and below a thin plate work to be buffed so that the opposite faces of the thin plate work may be buffed successively.

Figure 16:
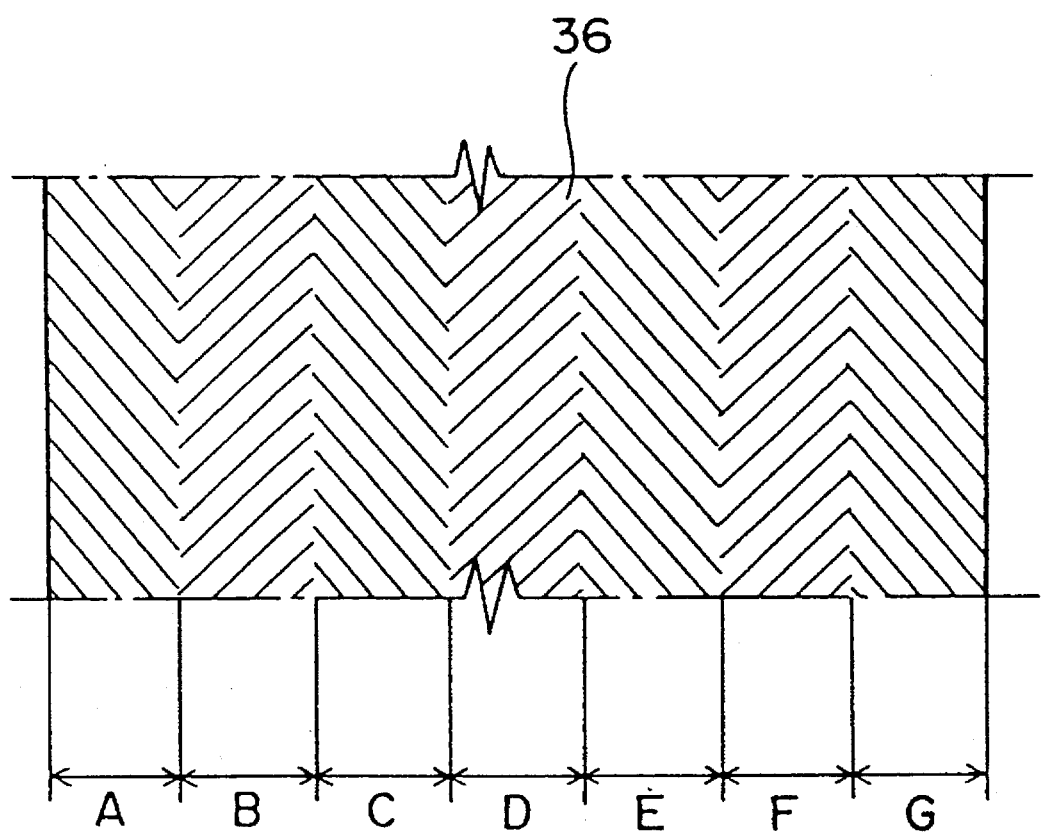
FIG. 16 is a diagrammatic view illustrating buffing ranges of individual buffing rollers.

FIG. 16 schematically shows buffing areas of the buffing rolls of the two buffing apparatus 35C and 35D shown in FIG. 14. From FIG. 16, it can be seen that the entire face of the thin plate work is buffed by the two buffing apparatus 35C and 35D.

Figures 17A, 17B:
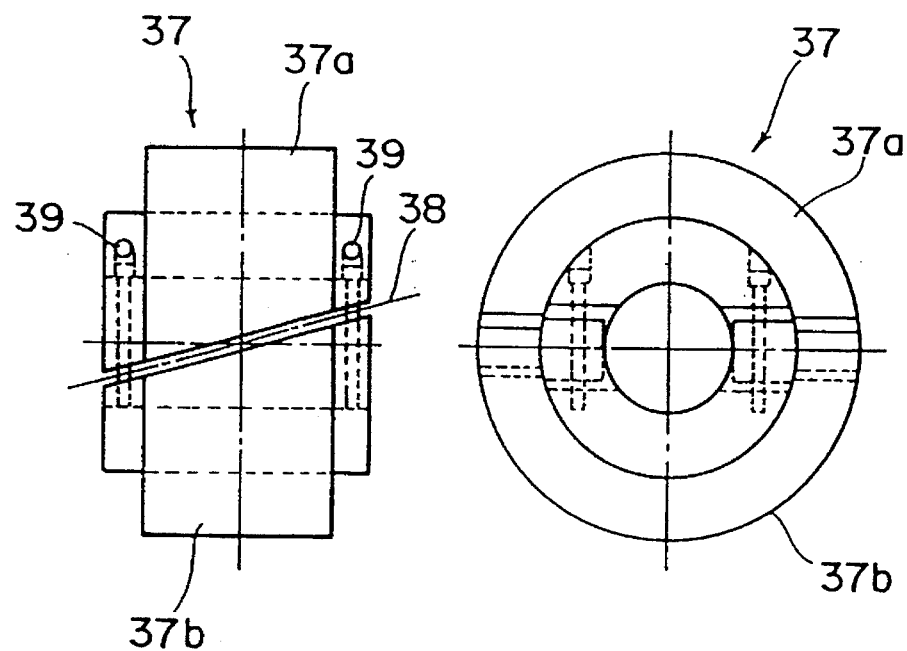
FIG. 17A is a front elevational view of a buffing roll divided into two segments along an inclined cutting plane.
FIG. 17B is a side elevational view of the buffing roll of FIG. 17A.
Figure 17C:
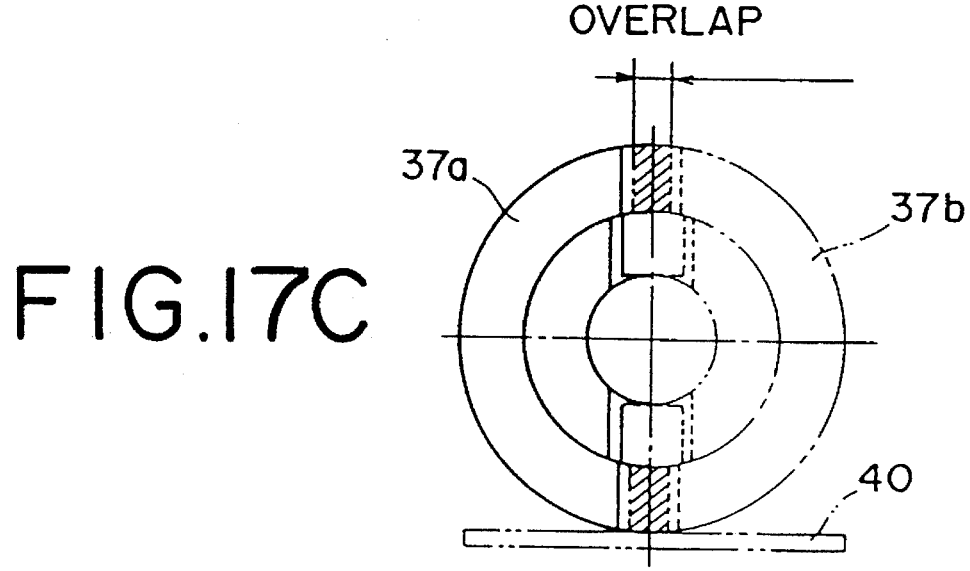
FIG. 17C is a schematic view illustrating an overlapping condition of cut portions of the buffing roll of FIG. 17A.

Subsequently, another embodiment of a buffing roll of the present invention will be described with reference to FIGS. 17A to 17C. In the present embodiment, a buffing roll 37 is split into two segments 37a and 37b along a cutting plane 38 inclined with respect to the center axis of the buffing roll 37, and the two split segments 37a and 37b are united to each other by means of bolts 39. Since the buffing roll is split into two segments, it can be mounted readily onto the shaft 13. Further, by adopting the buffing roll 37 split into two segments along an inclined plane as in the present embodiment, the cut portions can be overlapped with each other as seen in FIG. 17C, and consequently, a no-load portion can be eliminated. As a result, occurrence of vibrations upon buffing and a non-uniform buffing pattern can be prevented.

Subsequently, an embodiment which employs a holding wheel of a large diameter in place of the holding roll of a small diameter will be described with reference to FIGS. 18 to 20B. FIG. 18 illustrates the relationship between the large diameter holding wheel 42 and the buffing roll 12, and wherein FIG. 18(A) shows the buffing roll when it has a maximum outer profile; FIG. 18(B) shows the buffing roll when it has a minimum outer profile; and FIG. 18(C) shows the holding wheel 42. Where the dimensions are set as shown in FIG. 18, the inner diameter $\Phi D$ of the holding wheel 42 is given by $\Phi S \leq \Phi D \leq \Phi L$, and the outer diameter $\Phi D'$ of the holding wheel 42 is given by $2R'$. Further, the position C of the center line of the holding wheel 42 is given by $C=(H4-H1)/2=R'$.

Figure 19:
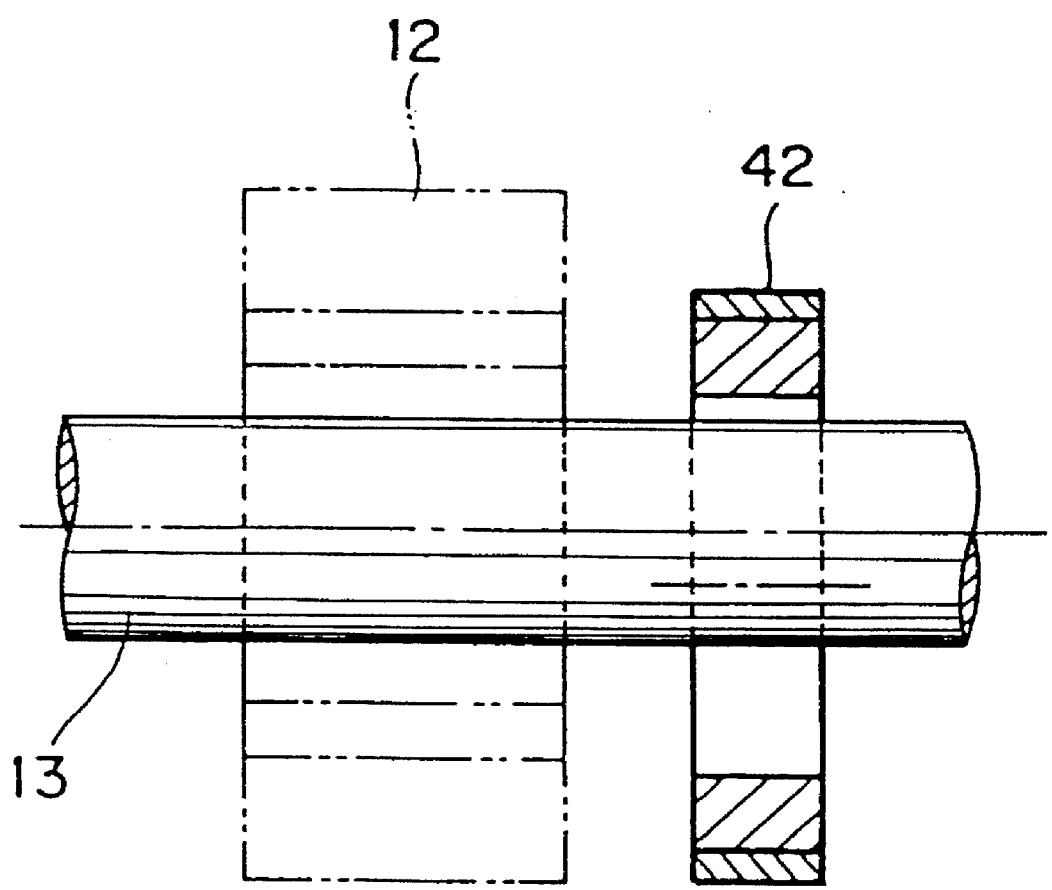
FIG. 19 is a partial sectional view illustrating the relationship between the large diameter holding wheel and the buffing roll when the outer profile of the buffing roll has a maximum size.
Figure 20A:
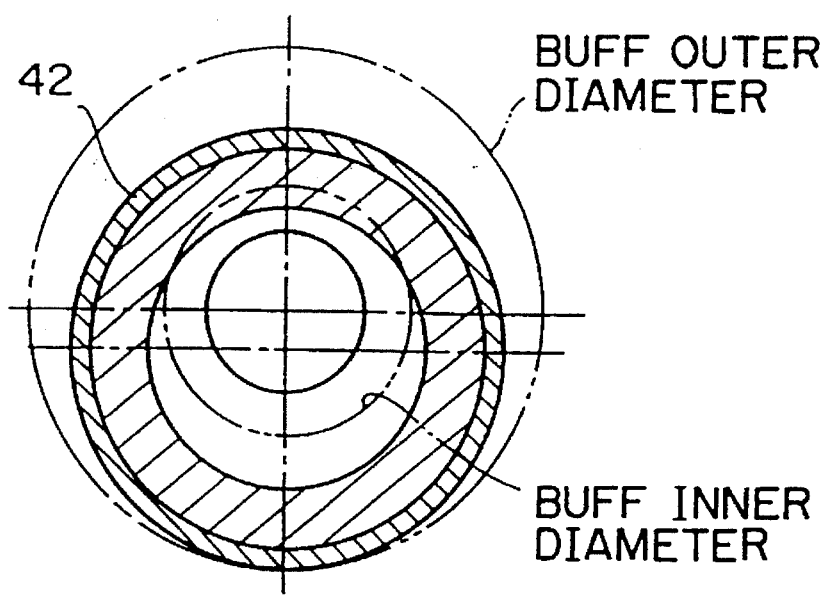
FIG. 20A is a sectional view illustrating the relationship between the large diameter holding wheel and the buffing roll when the outer profile of the buffing roll has a maximum size.
Figure 20B:
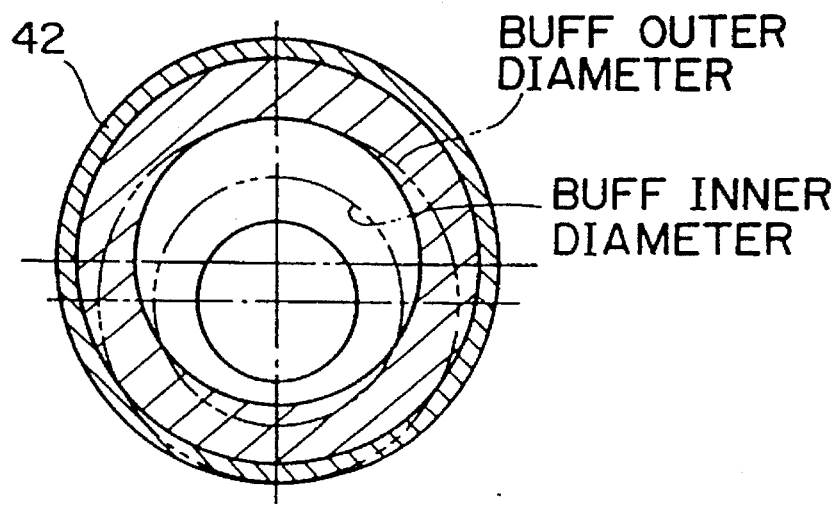
FIG. 20B is a sectional view illustrating the relationship between the large diameter holding wheel and the buffing roll when the outer profile of the buffing roll has a minimum size.

FIGS. 19 and 20A illustrates the relationship between the large diameter holding wheel 42 and the buffing roll when the buffing roll has a maximum outer profile, and FIG. 20B illustrates the relationship between the large diameter holding wheel 42 and the buffing roll when the buffing roll has a minimum outer profile. Even where such large diameter holding wheel 42 is disposed in place of a small diameter holding roll between each adjacent ones of the buffing rolls 12 as in the present embodiment, a rear end portion of a thin plate work to be buffed can be held effectively, and consequently, a bend or curve of a thin plate work arising from buckling can be prevented.

Figure 21:
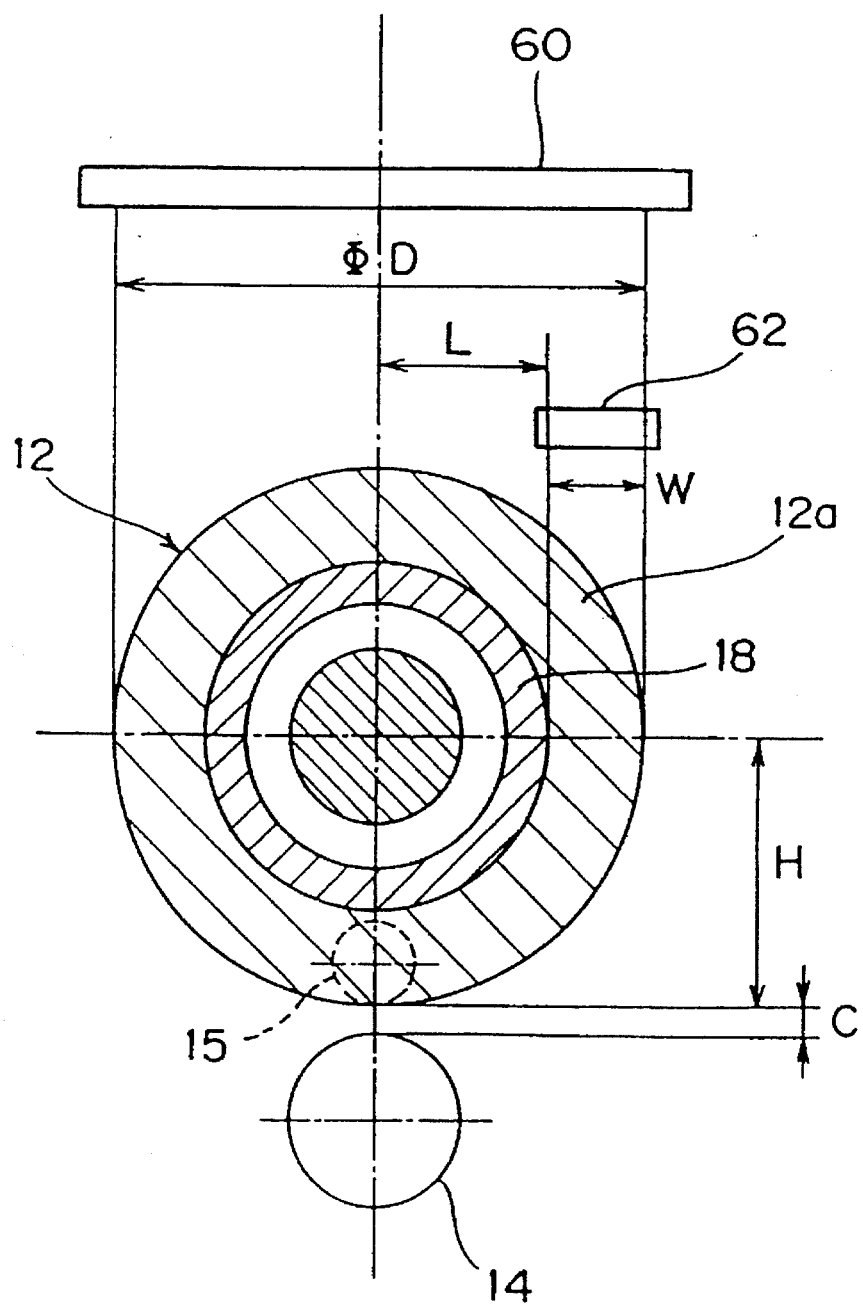
FIG. 21 is a diagrammatic view illustrating measurement of the diameter and the thickness of the buff when the buffing roll is new.
Figure 22:
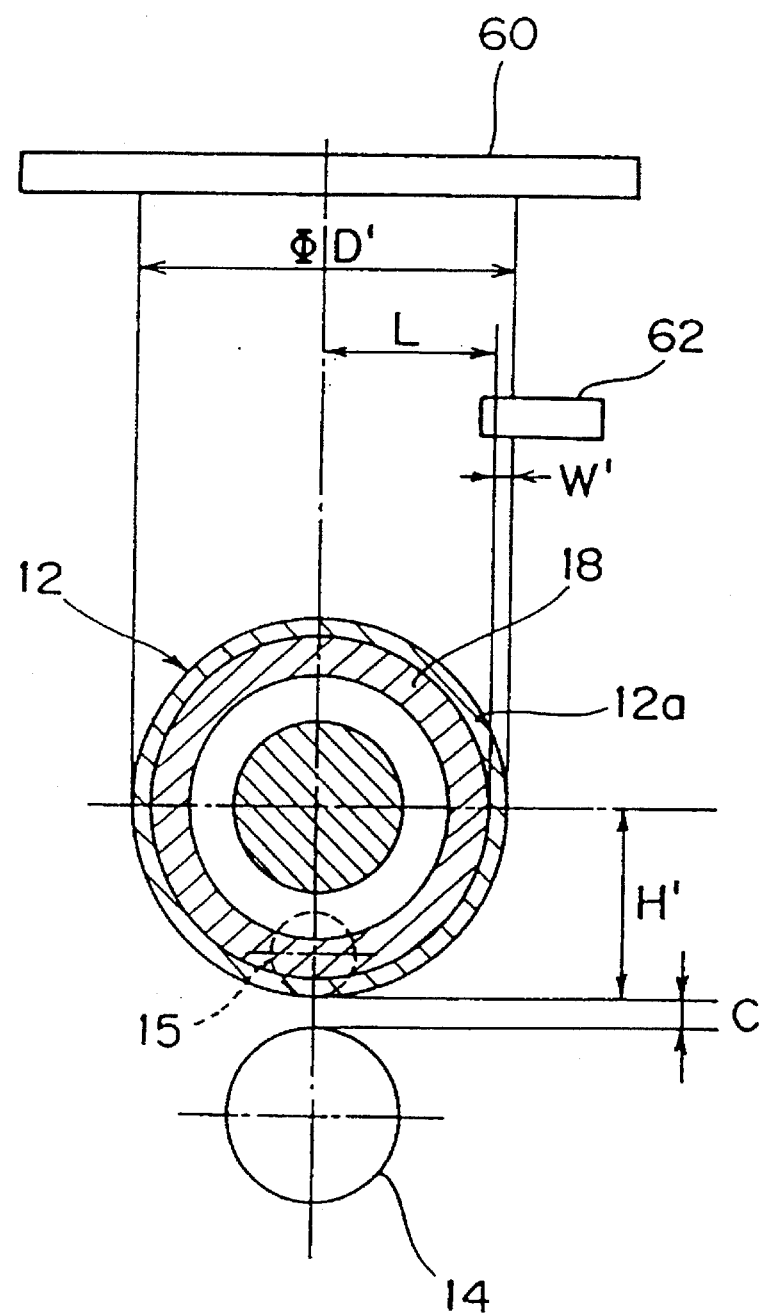
FIG. 22 is similar to FIG. 21 but illustrating measurement of the diameter and the thickness of the buff when the buffing roll is abraded.

Subsequently, measurement of the diameter and the thickness of the buff of a buffing roll will be described with reference to FIGS. 21 and 22. FIG. 21 shows a buffing roll when it is new, and FIG. 22 shows the buffing roll when it is abraded. Reference numeral 60 de-notes a diameter measurement sensor for measuring the diameter of a buffing roll, and reference numeral 62 denotes a buff thickness measurement sensor. The sensors 60 and 62 are each constituted from a laser sensor, a photo-sensor or a like sensor. In FIG. 21, $H=\frac{1}{2}\times\Phi D = L+W$, and in FIG. 22, $H'=\frac{1}{2}\times\Phi D'=L+W'$.

Figure 23:
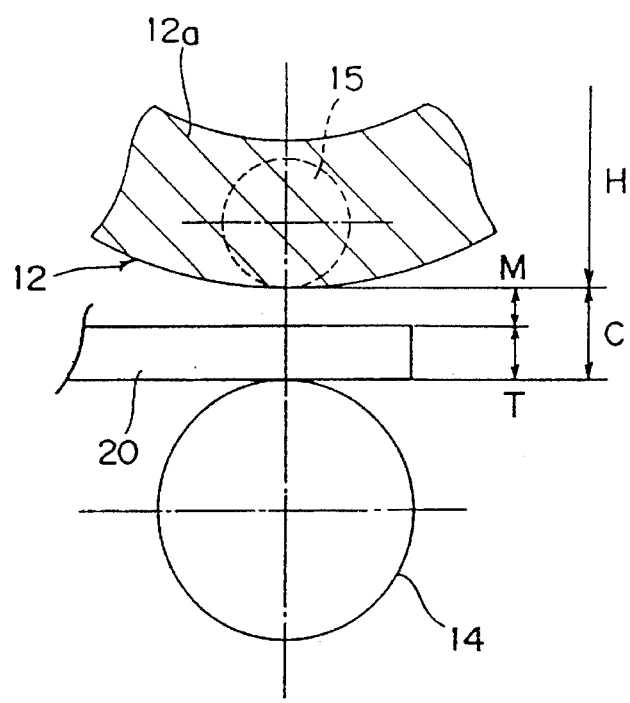
FIG. 23 As a diagrammatic view illustrating the amount of movement of the buffing roll from its standby position to its buffing position.

Accordingly, in the buffing apparatus of the present embodiment, by controlling the height H' of the buffing roll 12 in accordance with the thickness of the buff 12a, the buffing roll 12 can be held at its standby position spaced by a predetermined distance C from the backup roll 14 when buffing is not performed. Since the buffing roll 12 is held at the standby position spaced by the predetermined distance C from the backup roll 14 in this manner, if the buffing roll 12 is moved, upon buffing of a plate work 20 of the thickness T, by the amount M=C−T toward the backup roll 14 as shown in FIG. 23, the surface of the buffing roll 12 can be contacted with the surface of the plate work 20.

Figure 24:
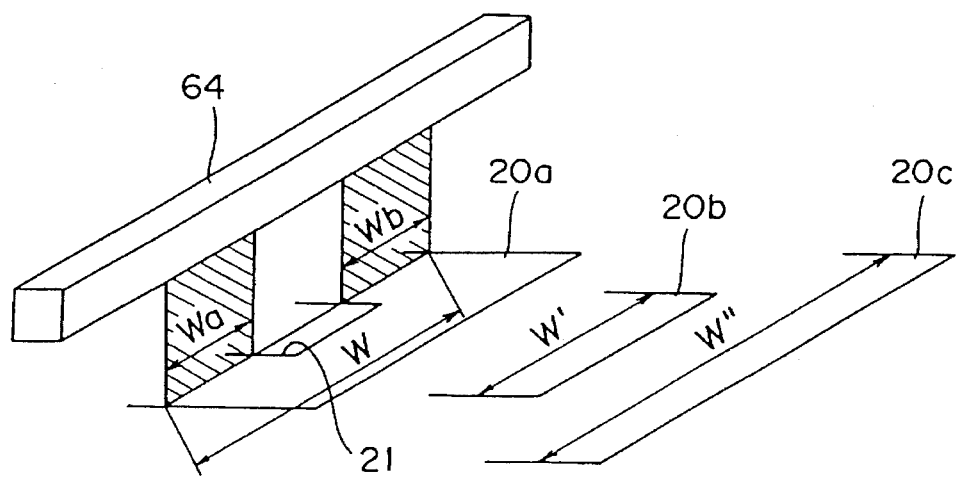
FIG. 24 is a diagrammatic view illustrating measurement of the width of a plate work.

Subsequently, measurement of a width of a plate work will be described with reference to FIG. 24. Reference numeral 64 denotes a width sensor, which is constituted from a photo-sensor of the reflection type or a like sensor. Widths W, W' and W" of works 20a, 20b and 20c are measured, respectively, by the width sensor 64. Since the work 20a has an opening 21, it is measured by the width sensor 64 such that the buffing width at a portion of the work 20a across the opening 21 is Wa+Wb. In the controlling method of the present embodiment, the buffing pressure is controlled in accordance with the width of the buffing portion of the work.

Figure 25A:
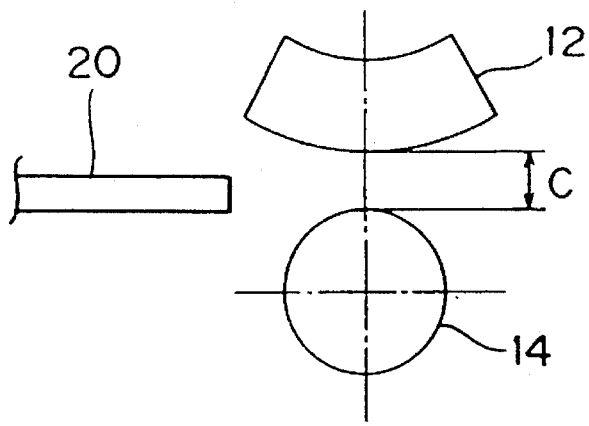
FIGS. 25A to 25C are diagrammatic views illustrating a method of controlling the buffing apparatus of the embodiment of the present invention.

Subsequently, a controlling method for the buffing apparatus of an embodiment of the present invention will be described with reference to FIGS. 6 and 25A to 25C. When the sensor 24 does not detect a plate work 20 to be buffed, the buffing rolls 12 are held at the standby position spaced by the predetermined distance from the backup roll 14 as shown in FIG. 25A without being rotated.

Figure 25B:
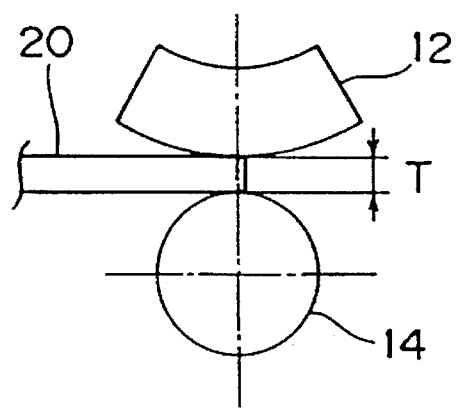

If the sensor 24 detects the work 20, the buffing rolls 12 are driven to rotate in the direction indicated by an arrow mark B in FIG. 6. Simultaneously, the thickness T of the work 20 being fed in the direction indicated by an arrow mark A is calculated by the control apparatus 25, and the buffing rolls 12 are moved by the amount C−T toward the backup rolls 14 so that the buffing rolls 12 are contacted with the plate work 20 as shown in FIG. 25B.

Figure 25C:
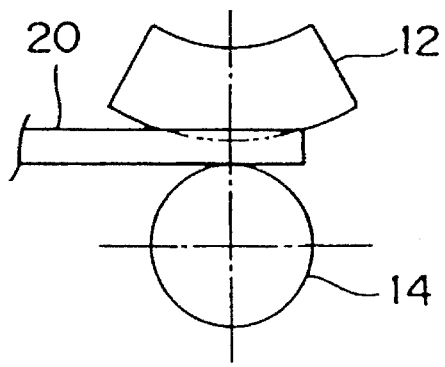

Further, the servomotor 40 is energized in accordance with an instruction of the control apparatus 25 in response to the width, the material and/or some other parameter of the plate work 20 to push down the first slide units 28 to further move down the buffing rolls 12 by a distance necessary for intended pressurization as shown in FIG. 25C. In this condition, the plate work 20 is fed in the direction of the arrow mark A in FIG. 6 and the buffing rolls 12 are rotated at the speed of about 2,000 to 3,000 rpm in the direction of the arrow mark B to effect buffing of the plate work 20.

When the sensor 24 detects the trailing end of the work 20, the control apparatus 25 controls so that rotation of the buffing rolls 12 is stopped. By such control, it can be prevented effectively that the rear end of the plate work 20 is caught and buckled by rotation of the buffing rolls 12 to be bent or curved upwardly.

Further, in the present invention, buffing data regarding the material of the buff, the buffing pressure, the kinds of works to be buffed, the circumferential velocities of the buff and so forth are stored in advance in a memory of the control apparatus 25, and actual buffing conditions such as the buffing speed, the diameter of the buff and so forth are measured and the speed of rotation of the buffing rolls is automatically controlled so that the plate work can be buffed to a designated buffing amount. Further, since the buffing rolls are held at the standby position spaced by a predetermined distance from the backup roll and the buffing rolls are moved toward the backup roll in response to the thickness of the work to be buffed, works having different thicknesses can be supplied successively.

While the foregoing description is given of the example wherein the present invention is applied to a buffing roll, the present invention is not limited to this, and a brush cleaning apparatus having similar effects to those of the buffing apparatus can be provided by employing brush rolls in place of the buffing rolls.

Since the present invention is constructed in such a manner as described in detail above, the following meritorious effects are achieved.

(1) Buffing and brush cleaning of a thin plate member are effectively achieved.

(2) Where a plurality of buffing apparatus or brush cleaning apparatus are installed, buffing or brush cleaning of an entire face of a thin plate member is achieved.

(3) Since a plurality of buffing rolls can be secured accurately at positions set in advance, a uniform buffing amount can be assured.

(4) Where a buffing roll split into two segments along an inclined plane is employed, an exchanging operation of the buffing roll can be reduced while assuring stable rotation of the buffing roll.

(5) An otherwise possible bend or curve of a thin plate member when it advances into and passes through the buffing apparatus or the brush cleaning apparatus upon buffing or brush cleaning can be prevented effectively.

(6) Origin control of a buffing roll (plate pressure control and buffing pressure control) is permitted.

(7) A variation in thickness of a thin plate member can be followed up automatically, and materials having different thicknesses can be supplied successively.

(8) A variation in width can be followed up automatically, and materials having different widths can be supplied successively.

What is claimed is:

1. A buffing apparatus, comprising:
   a plurality of buffing rolls removably secured in a predetermined spaced relationship from each other to a shaft which is driven to rotate;
   a backup roll disposed in parallel to said buffing rolls and extending over an overall length of all of said buffing rolls; and
   a holding roll disposed at least between each adjacent ones of said buffing rolls, said holding roll being positioned such that an axis thereof is positioned on a straight line interconnecting a center of a transverse section of one of said buffing rolls and a center of a transverse section of said backup roll and an outer periphery thereof substantially contacts with a contacting plane of said buffing rolls.

2. A buffing apparatus according to claim 1, further comprising additional holding rolls located on outer sides of other of said buffing rolls located on the opposite ends of said shaft.

3. A buffing apparatus according to claim 1, wherein said shaft has a plurality of annular grooves formed thereon in a spaced relationship from each other, and said buffing rolls are secured to said shaft by fitting two-segment split collars into each of said annular grooves.

4. A buffing apparatus according to claim 1, wherein each of said buffing rolls is split into two segments along a cutting plane inclined relative to a center axis of each of said buffing rolls being split.

5. A buffing apparatus according to claim 1, further comprising:
   a pair of guide rails;
   a pair of first slide units mounted for sliding movement on said guide rails;
   a pair of second slide units mounted for sliding movement on said guide rails, said shaft being supported for rotation on said pair of second slide units;
   a pair of first driving means mounted on said first slide units for slidably moving said second slide units along said respective guide rails; and
   buffing pressure adjustment means for slidably moving said first slide units simultaneously in a same direction along said guide rails.

6. A buffing apparatus according to claim 5, wherein said buffing pressure adjustment means includes:
   a hydraulic pump;
   a hydraulic cylinder operatively connected to said hydraulic pump, said hydraulic cylinder having a piston rod;
   an arm having an end connected to an end of said piston rod;
   a pressure adjustment shaft secured to the other end of said arm and supported for rotation; and
   a pair of linkages for converting rotational motion of said pressure adjustment shaft into sliding motion of said pair of first slide units.

7. A buffing apparatus array, comprising:
   a first buffing apparatus disposed above a plate work to be buffed; and
   a second buffing apparatus disposed in a spaced relationship from said first buffing apparatus above the plate work,
   wherein each of said first and second buffing apparatus comprises:
   a plurality of buffing rolls removably secured in a predetermined spaced relationship from each other to a shaft which is driven to rotate,
   a backup roll disposed in parallel to said buffing rolls and extending over an entire length of all of said buffing rolls, and
   a holding roll disposed at least between each adjacent ones of said buffing rolls, said holding roll being positioned such that an axis thereof is positioned on a straight line interconnecting a center of a transverse section of one of said buffing rolls and a center of a transverse section of said backup roll and an outer periphery thereof substantially contacts with a contacting plane of said buffing rolls,
   wherein adjacent ones of said buffing rolls of said first buffing apparatus have spaces therebetween, and
   wherein said buffing rolls of said second buffing apparatus are aligned, in a work feeding direction, along said spaces between said adjacent ones of said buffing rolls of said first buffing apparatus.

8. A buffing apparatus array according to claim 7, further comprising:
   a third buffing apparatus disposed below the plate work; and
   a fourth buffing apparatus disposed in a spaced relationship from said third buffing apparatus below the plate work,
   wherein each of said third and fourth buffing apparatus comprises:
   a plurality of second buffing rolls removably secured in a predetermined spaced relationship from each other to second shaft which is driven to rotate,
   a second backup roll disposed in parallel to said second buffing rolls and extending over an entire length of all of said second buffing rolls, and a second holding roll disposed at least between each adjacent ones of said second buffing rolls, said second holding roll being positioned such that an axis thereof is positioned on a straight line interconnecting a center of a transverse section of one of said second buffing rolls and a center of a transverse section of said second backup roll and an outer periphery thereof substantially contacts with a contacting plane of said second buffing rolls, wherein adjacent ones of said second buffing rolls of said third buffing apparatus have spaces therebetween, and wherein said second buffing rolls of said fourth buffing apparatus are aligned, in a work feeding direction, along said spaces between said adjacent ones of said buffing rolls of said third buffing apparatus.

9. A buffing method for buffing a plate work using first and second buffing apparatus, each of said first and second buffing apparatus having a plurality of buffing rolls removably secured in a predetermined spaced relationship to a shaft which is driven to rotate, and a backup roll disposed in parallel to said buffing rolls and extending over an entire length of all of said buffing rolls, said buffing method comprising the steps of:

disposing said first buffing apparatus above the plate work;

disposing said second buffing apparatus in a spaced relationship from said first buffing apparatus above the plate work, said buffing rolls of said first and second buffing apparatus being aligned in an alternate pattern in a work feeding direction;

buffing a first area of the plate work by said first buffing apparatus; and buffing a second area of the plate work, which has not been buffed by said first buffing apparatus, by said second buffing apparatus.

10. A buffing method for buffing a plate work according to claim 9, further comprising the steps of:

disposing a third buffing apparatus which has the same construction as said first and second buffing apparatus below the plate work;

disposing a fourth buffing apparatus which has the same construction as said first and second buffing apparatus in a spaced relationship from said third buffing apparatus below the plate work, said buffing rolls of said third and fourth buffing apparatus being aligned in an alternate pattern in the work feeding direction;

buffing a third area of a rear face of the plate work by said third buffing apparatus; and buffing a fourth area of the rear face of the plate work, which has not been buffed by said third buffing apparatus, by said fourth buffing apparatus.

* * * * *